(12) United States Patent  
Merritt et al.

(10) Patent No.: US 6,654,306 B2
(45) Date of Patent: Nov. 25, 2003

(54) APPARATUS AND METHOD FOR GENERATING AN OSCILLATING SIGNAL

(75) Inventors: Todd A. Merritt, Boise, ID (US); Hal W. Butler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/338,565

(22) Filed: Jan. 7, 2003

(65) Prior Publication Data

US 2003/0095461 A1 May 22, 2003

Related U.S. Application Data

(63) Continuation of application No. 09/945,253, filed on Aug. 30, 2001, now Pat. No. 6,577,552.

(51) Int. Cl.$^7$ ................................................ G11C 8/00
(52) U.S. Cl. .................. 365/226; 365/189.05; 365/233; 331/60
(58) Field of Search ................................ 365/226, 233, 365/189.05; 331/107 P, 60; 327/361, 115, 294, 295

(56) References Cited

U.S. PATENT DOCUMENTS

| | | | |
|---|---|---|---|
| 4,514,696 A | * 4/1985 | Genrich | 331/107 P |
| 5,126,590 A | 6/1992 | Chern | 307/296.2 |
| 5,172,013 A | 12/1992 | Matsumura | 307/296.2 |
| 5,537,306 A | 7/1996 | Blodgett | 363/60 |
| 5,642,073 A | 6/1997 | Manning | 327/536 |
| 5,677,645 A | 10/1997 | Merritt | 327/536 |
| 5,692,164 A | 11/1997 | Pantelakis | 395/556 |
| 5,828,095 A | 10/1998 | Merritt | 257/299 |
| 5,831,470 A | 11/1998 | Park et al. | 327/536 |
| 5,939,935 A | 8/1999 | Merritt | 327/536 |
| 5,943,226 A | 8/1999 | Kim | 363/60 |
| 6,023,187 A | 2/2000 | Camacho et al. | 327/536 |
| 6,055,193 A | 4/2000 | Manning et al. | 365/189.11 |
| 6,075,402 A | 6/2000 | Ghilardelli et al. | 327/536 |
| 6,121,822 A | 9/2000 | Merritt | 327/536 |
| 6,208,197 B1 | 3/2001 | Ternullo, Jr. et al. | 327/536 |
| 6,225,854 B1 | 5/2001 | Cha | 327/536 |
| 6,229,381 B1 | 5/2001 | Keeth | 327/536 |
| 6,240,042 B1 | * 5/2001 | Li | 365/233 |
| 6,285,241 B1 | 9/2001 | Yoshida | 327/536 |

* cited by examiner

*Primary Examiner*—Tan T. Nguyen
(74) *Attorney, Agent, or Firm*—Dorsey & Whitney LLP

(57) ABSTRACT

An apparatus and method for generating a plurality of output signals that can be used for driving a corresponding plurality of charge pumps from a signal oscillating between a first and second logic state. The apparatus includes a plurality of shift register stages coupled in series, where the shift register stages shift a latched logic state in response to the oscillating signal. Further included in the apparatus is a duty cycle correcting circuit coupled to the output terminals of the shift register stages which generates each of the output signals that can be used to drive a charge pump based on the latched logic state of two of the shift register stages.

21 Claims, 7 Drawing Sheets

APPARATUS AND METHOD FOR GENERATING AN OSCILLATING SIGNAL

CROSS-REFERENCE TO RELATED APPLICATION

This application is a continuation of pending U.S. patent application Ser. No. 09/945,253, filed Aug. 30, 2001 now U.S. Pat. No. 6,577,552.

TECHNICAL FIELD

The present invention relates to voltage generating circuits, and, more particularly, to a method and circuit for providing a plurality of oscillating signals that can be used for generating a pumped output voltage.

BACKGROUND OF THE INVENTION

In many electronic circuits, charge pump circuits are utilized to generate a positive pumped voltage having an amplitude greater than that of a positive supply voltage, or to generate a negative pumped voltage from the positive supply voltage, as understood by those skilled in the art. For example, a typical application of a charge pump circuit is in a conventional dynamic random access memory ("DRAM"), to generate a boosted word line voltage VCCP having an amplitude greater than the amplitude of a positive supply voltage VCC or a negative substrate or back-bias voltage Vbb that is applied to the bodies of NMOS transistors in the DRAM. A charge pump may also be utilized in the generation of a programming voltage VPP utilized to program data into memory cells in non-volatile electrically block-erasable or "FLASH" memories, as will be understood by those skilled in the art.

A conventional charge pump circuit is illustrated in FIG. 1a. A voltage regulator monitors the voltage level and activates an oscillator to drive or boot the pump stage when a boosted voltage VCCP needs to be produced. Several designs of oscillators and pump stages are well known in the art. In designing charge pump circuits, not only do charge pumps need to be able to generate sufficient voltage levels, but the circuits should also be designed to produce the boosted voltage with sufficient drive capability in an efficient and reliable manner. These features become more important as operating voltages continue to decrease, as well as the increasing demand for devices having charge pump circuits that consume less power.

One approach that has been taken in designing charge pump circuits that can provide boosted voltages with sufficient drive capability is to use a plurality of pump stages operating in parallel. In order to minimize the size of the circuitry, the plurality of pump stages are driven by a common oscillator circuit that provides a signal to the input of each of the pump stages. However, as a result of the pump stages being driven in by a common signal, extreme peak current values may occur when the pump stages are initially enabled. The device in which the charge pump is included may be adversely affected by such peak currents.

In response to the peak current issue, charge pumps have been designed such that the pump stages are driven in a staggered fashion to avoid concurrent booting of each pump stage. FIG. 1b illustrates an example of such a charge pump circuit. An oscillator provides an oscillating signal OSC to the first pump stage. The OSC signal is delayed through a first delay circuit before being applied to a second pump stage. Similarly, a third pump stage receives a more delayed OSC signal than a second pump stage. The remaining pump stages, that is, the fourth through sixth pump stages, receive a continually more delayed OSC signal. As a result, each of the pump stages is booted at a different time to avoid creating a severe current load when the charge pump is enabled. A problem, however, with the previously described charge pump circuit is that once a OSC signal is provided to the first pump stage, the other five remaining pump stages will necessarily be booted as well, regardless of whether all six of the pump stages need to be booted to provide a sufficient boosted voltage level. That is, the OSC signal will necessarily propagate through the plurality of delay circuits once the OSC signal is provided. In essence, the power consumed in unnecessarily booting the extraneous pump stages is wasted, thus introducing considerable inefficiencies.

The charge pump circuit illustrated in FIG. 1b has been modified to avoid the unnecessary booting of pump stages by including latches that can be used to halt the propagation of an OSC signal through the chain of delay circuits where less than all of the pump stages need to be booted. The transmission of the OSC signal through the latches is typically under the control of the voltage regulator, which determines how many pump stages should be booted to provide a sufficient boosted voltage. Where less than all of the pump stages are needed, the latch following the last of the necessary pump stages latches the propagating OSC signal and prevents the OSC from further progressing through the chain of delay circuits. Thus, the pump stages downstream of the latch will not be booted.

Although the inclusion of latches in the charge pump is an improvement over the charge pump circuit illustrated in FIG. 1b, inefficiencies are nevertheless still present. In particular, when the charge pump is activated, the first pump stage is always the first to be booted, regardless of where in the sequence of booting the pump stages the oscillator is halted. A situation that illustrates the inefficiencies is as follows. All of the pump stages of the charge pump are being booted by a continuous OSC signal until a sufficient boosted voltage VCCP level is achieved, at which time the voltage regulator halts the oscillator from further providing the OSC signal. At a subsequent time, the voltage regulator restarts the oscillator and boots only the first three pump stages to restore a diminishing VCCP level. After the three pump stages are booted, the oscillator is once again halted. Shortly thereafter, the VCCP level decreases enough to require continuous booting of all of the pump stages. The voltage regulator restarts the oscillator and allows the OSC signal to propagate from the first pump stage through the chain of delay circuits to the sixth pump stage.

In the previous scenario, inefficiency of the charge pump circuit results from the stored charge of the fourth through sixth pump stages being wasted because activation of the charge pump always begins from the first pump stage. More specifically, when the oscillator is first halted, all of the pump stages have been booted and have charge stored on the respective boot nodes. Following the second time the oscillator is halted, only the first three pump stages have been booted, which allows the charge on the boot nodes of the fourth through sixth pump stages to discharge. When the charge pump is restarted again, all of the pump stages are booted in sequence again starting with the first pump stage and progressing through to the sixth pump stage, although the first through third pump stages were most recently booted. While the first through third pump stages are being booted, the charge on the fourth through sixth pump stages continue to discharge until the OSC signal propagates through to chain of delay circuits. A more efficient approach would have been to take advantage of the charge on the boot nodes of the fourth through sixth pump stages before allowing it to discharge rather than restarting the charge pump from the first pump stage.

SUMMARY OF THE INVENTION

The present invention is directed to an apparatus and method for generating a plurality of output signals that can be used for driving a corresponding plurality of charge pumps from a signal oscillating between a first and second logic state. The apparatus includes a plurality of shift register stages coupled in series. Each of the shift register stages has a control terminal for receiving the oscillating signal and further has input and output terminals. The output of the last shift register stage is coupled to the input of the first shift register stage of the plurality. The shift register stages shift a latched logic state from the input terminal to the output terminal in response to the oscillating signal. The apparatus further includes a duty cycle correcting circuit having input terminals coupled to the output terminals of the shift register stages as well as output terminals at which the plurality of output signals are provided. The duty cycle correcting circuit generates each of the output signals that can be used to drive a charge pump based on the latched logic state of two of the shift register stages.

DETAILED DESCRIPTION OF THE INVENTION

Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figures 1A, 1B:
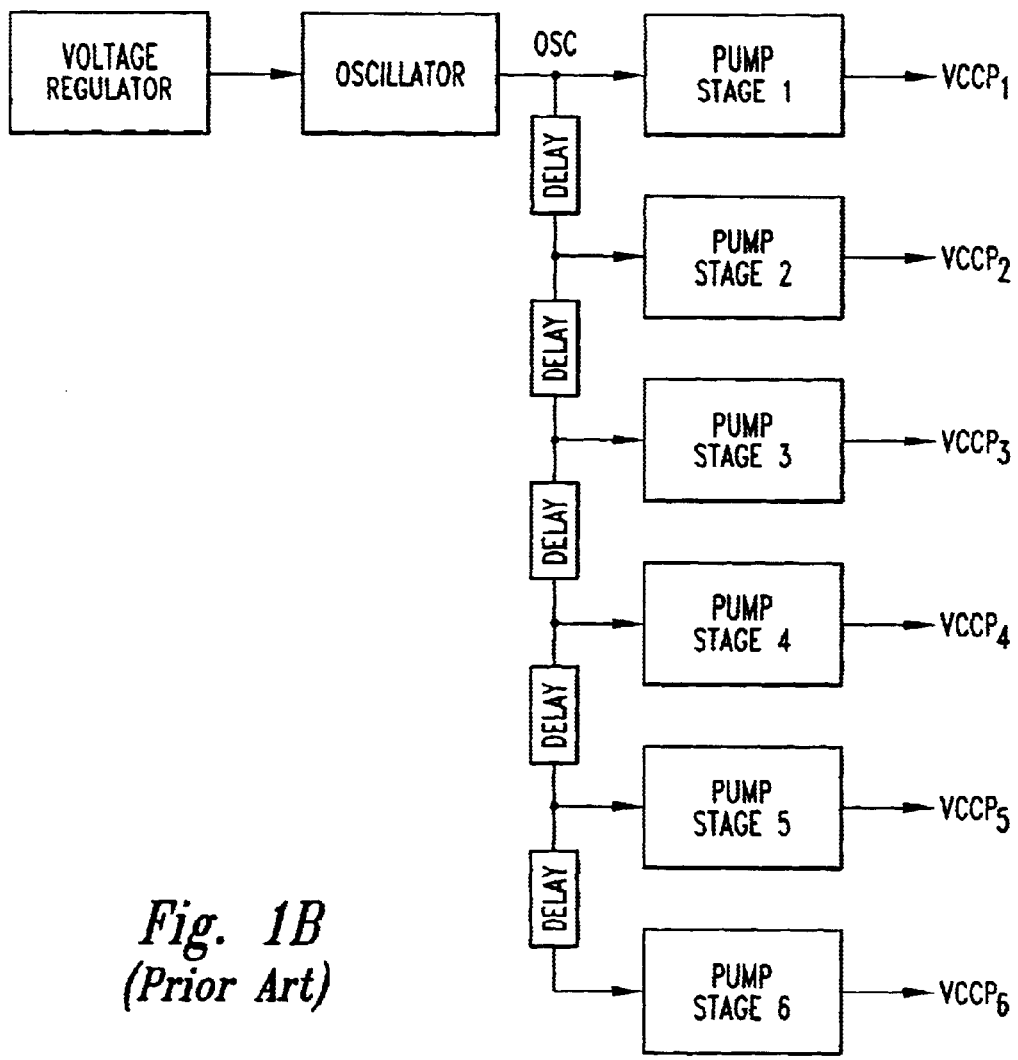
FIGS. 1a and 1b are functional block diagrams of conventional charge pump circuits.
Figure 2:
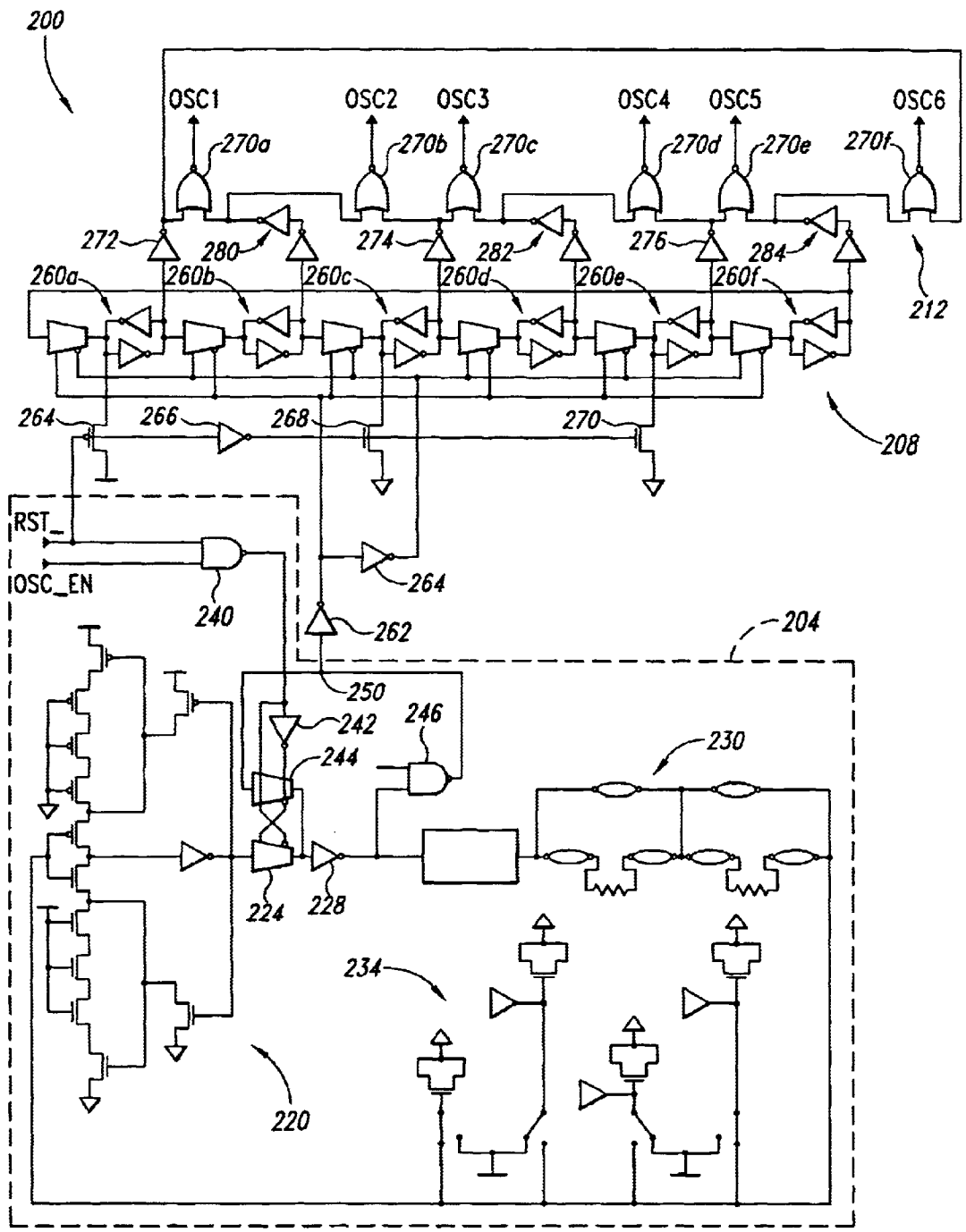
FIG. 2 is a schematic diagram of an oscillator circuit according to an embodiment of the present invention.

FIG. 2 illustrates an oscillator circuit 200 according to an embodiment of the present invention. The oscillator circuit 200 includes an oscillator stage 204 having an output coupled to a shift register 208. The shift register 208 provides a plurality of output terminals that are coupled to a duty cycle correcting circuit 212. The output terminals of the duty cycle correcting circuit 212 can be coupled to conventional charge pump stages, as well known in the art, to drive the pump stages in order to produce a boosted voltage signal. As illustrated in FIG. 2, the oscillator circuit 200 provides six output signals that can be used to drive six charge pump stages. However, it will be appreciated that modifying the oscillator circuit 200 to provide fewer or greater output signals is well within the understanding of those of ordinary skill in the art, and is a detail that can be modified without deviating from the scope of the present invention.

The oscillator stage 204 provides a signal at an output node 250 that has a frequency based on the impedance of a resistance stage 230 and a capacitance stage 234. A signal driver stage 220 provides an output signal through a transfer gate 224 and through an inverter 228 to an input of a NAND gate 246. The NAND gate 246 also receives as an input an active low reset signal RST_, which, as will be explained in greater detail below, resets the oscillator stage 204 and the shift register 208. The output of the NAND gate 246 is coupled to the output node 250 at which the periodic output signal is provided to the shift register 208. The oscillator stage 204 further includes a NAND gate 240 having a first input receiving the RST_ signal, and a second input receiving an active high oscillator enable signal OSC_EN. When both the RST_ and OSC_EN signals are both HIGH, that is, no reset is requested and the oscillator 204 is enabled, the output of the driver stage 220 is coupled through the transfer gate 224, the inverter 228, and the NAND gate 246 to the output node 250 to provide a periodic output signal. However, if either the RST_ or OSC_EN signals are low, that is, a reset has been requested or the oscillator 204 is disabled, the transfer gate 224 is switched OFF to decouple the output of the driver stage 220, and a transfer gate 244 is switched ON to couple through the inverter 228 the output of the NAND gate 246 back to its own input. As a result, the oscillating output signal at the node 250 is locked to the last logic state. Where the oscillating stage is disabled by the OSC_EN signal, when the OSC_EN signal becomes active again, the output of the driver stage 220 is once again coupled through the transfer gate 224 and the inverter 228 to the input of the NAND gate 246 to resume provision of the periodic output signal at the node 250.

As illustrated in FIG. 2, the shift register 208 includes six latch stages 260a–260f coupled in series. The output of the final latch stage 260f is coupled back to the input of the first latch stage 260a. Each latch stage 260a–260f includes a transfer gate and a latch formed from a pair of inverters. The control terminals of the transfer gates of each of the latch stages 260a–260f are coupled to the output of either inverter 262 or 264. In the arrangement shown in FIG. 2, the latch stages 260a, 260c, and 260e latch new data in response to a LOW output signal from the oscillator stage 204, while the latch stages 260b, 260d, and 260f latch new data in response to a HIGH output signal from the oscillator stage 204. Thus, data is shifted from one latch stage to another as the oscillating output signal of the oscillator stage 204 cycles between HIGH and LOW. The shift register 208 further includes reset circuitry formed by transistors 264, 268, and 270, and an inverter 266. In response to the RST_ signal going LOW, the latches of latch stages 260a, 260c, and 260e are set to LOW, HIGH and HIGH, respectively. That is, upon reset of the shift register 208, the first latch stage 260a is set to LOW data, while the latch stages 260c and 260f are set to HIGH data.

The duty cycle correcting circuit 212 includes six two-input NOR gates 270a–270f that provide the output signals OSC1–OSC6 to drive a plurality of pump in a staggered fashion. One input of each of the NOR gates 270a–270f is coupled to the output of an inverter 272, 274, or 276, and the other input is coupled to a pair of series-coupled inverters 280, 282, or 284. With this arrangement, a NOR gate 270a–270f provides a HIGH output signal when the latch to which the single inverter 272, 274, or 276 is coupled latches HIGH data, and the latch to which the pair of series-coupled inverters 280, 282, or 284 is coupled latches LOW data.

Although the oscillator circuit has been described as including the particular oscillator stage 204, conventional or well-known frequency generating circuitry could be substituted for the oscillator stage 204 instead and still remain within the scope of the present invention. As previously described, the oscillator stage 204 provides an oscillating output signal that is used to drive the shift register 208. Alternative oscillation circuitry that can be substituted for or modified to replace the oscillator circuit 204 are well understood by those of ordinary skill in the art. It will further be appreciated that rather than using the output of the duty cycle correcting circuit 212 to drive conventional charge pump stages, the output signals of the register 208 can be used instead.

Figure 3:
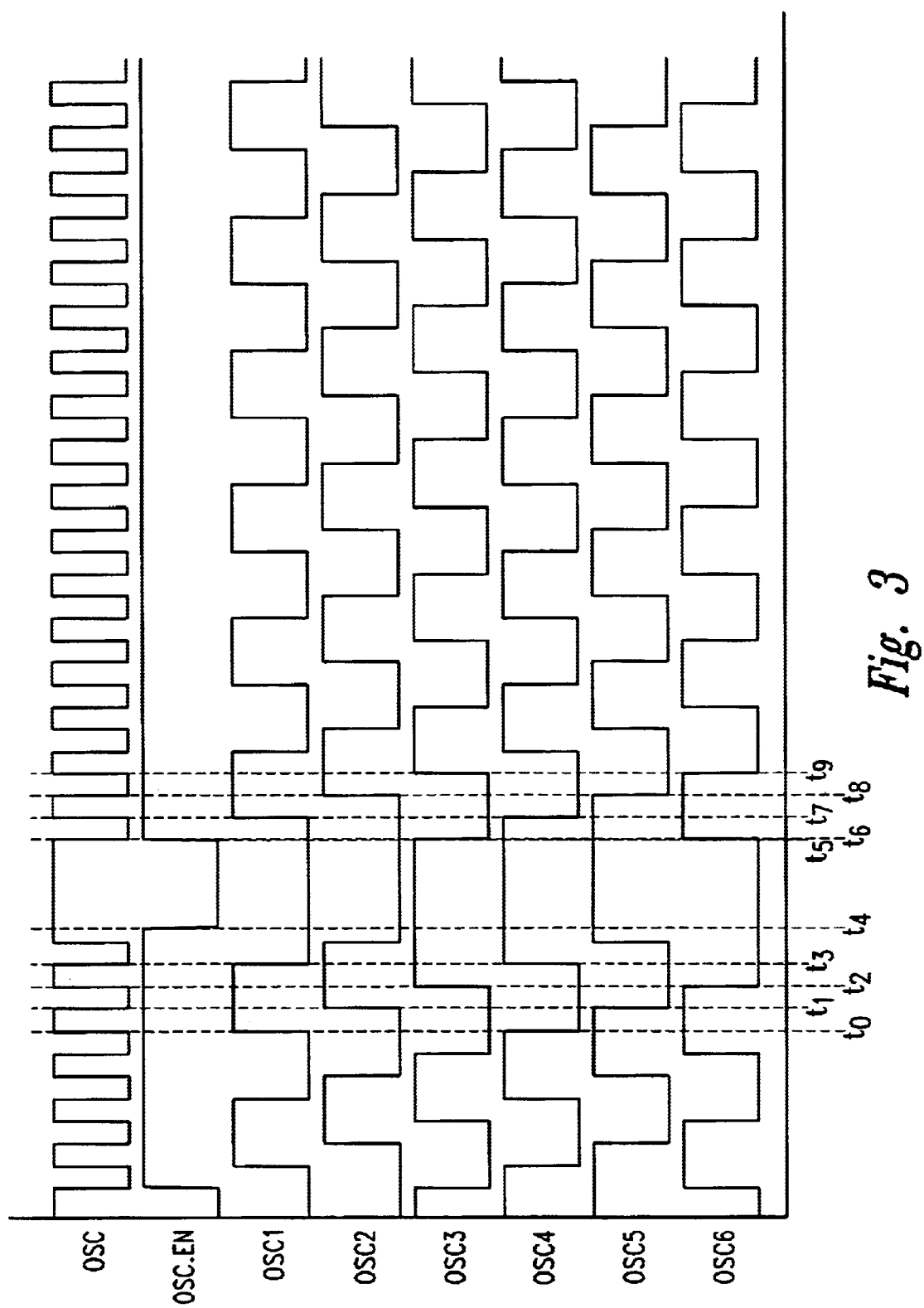
FIG. 3 is a signal diagram illustrating various signals of the oscillator circuit FIG. 2.
Figure 4A:
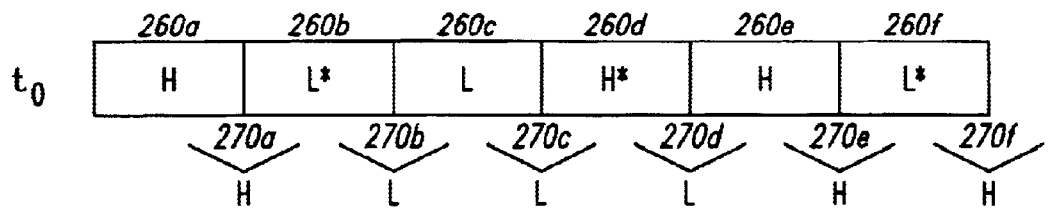
FIGS. 4a–4d are diagrams illustrating logic states and output levels of the oscillator circuit of FIG. 2 at various times.
Figure 4B:
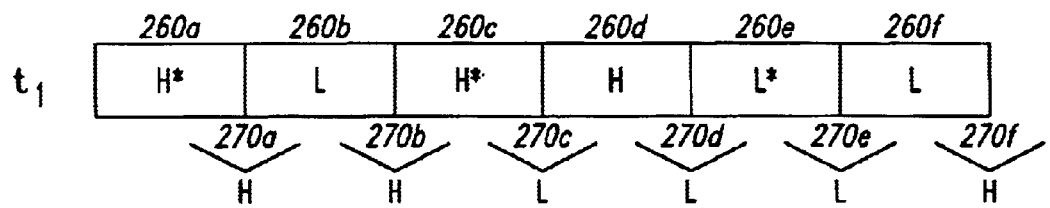
Figure 4C:
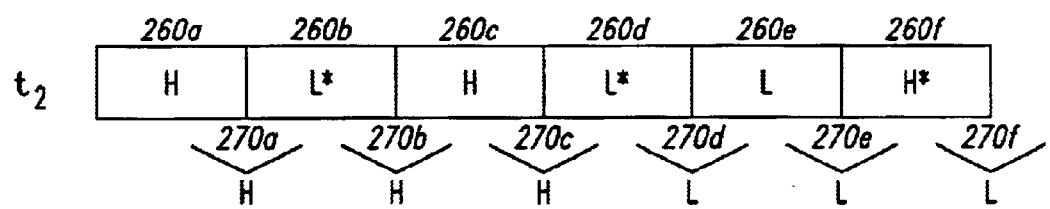
Figure 4D:
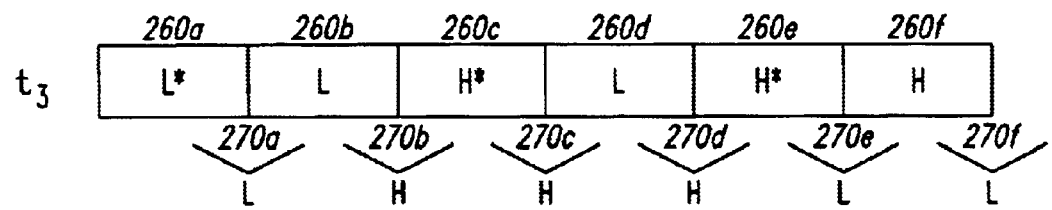

Operation of the oscillator circuit 200 will be described with reference to FIGS. 3 and 4. FIG. 3 is a signal diagram of the output signals OSC1–OSC6, the OSC_EN signal, and the output signal OSC at the node 250. At a time to, the OSC_EN signal is HIGH to enable the oscillator stage 204. The OSC5 and OSC6 output signals of the NOR gates 270e and 270f, respectively, are HIGH, and the OSC1 output signal of the NOR gate 270a is forced HIGH in response to the transition in the OSC signal. FIG. 4a illustrates the logic state of the latch stages 260a–260f at time to. The asterisk in the boxes for latch stages 260b, 260d, and 260f indicate that the data is latched during the most recent transition of the OSC signal.

At a time $t_1$ (FIGS. 3 and 4b), the latch stages 260a, 260c, and 260e latch new data, and as a result, the OSC6 and OSC1 signals of the NOR gates 270f and 270a, respectively, remain HIGH. The OSC2 signal of the NOR gate 270b is forced HIGH and the OSC signal is forced LOW in response to the transition in the OSC signal. At a time $t_2$ (FIGS. 3 and 4c), the latch stages 260b, 260d, and 260f latch new data, and as a result, the OSC1 and OSC2 signals of the NOR gates 270a and 270b, respectively, remain HIGH. The OSC3 signal of the NOR gate 270c is forced HIGH and the OSC6 signal is forced LOW in response to the transition in the OSC signal. Similarly, at a time $t_3$ (FIGS. 3 and 4d), the latch stages 260a, 260c, and 260e latch new data, and as a result, the OSC2 and OSC3 signals of the NOR gates 270b and 270c, respectively, remain HIGH. The OSC4 signal of the NOR gate 270d is forced HIGH and the OSC1 signal is forced LOW in response to the transition in the OSC signal. As illustrated by FIGS. 3 and 4, and the present example, the output signals OSC1–OSC6 remain HIGH for three transitions of the OSC signal, or put another way, the frequency of the OSC1–OSC6 signals are on-third of the frequency of the OSC signal.

Figure 5A:
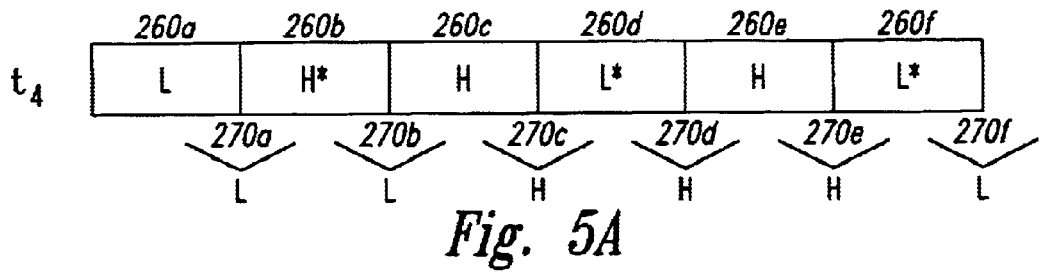
FIGS. 5a–5e are additional diagrams illustrating logic states and output levels of the oscillator circuit of FIG. 2 at various times.
Figure 5B:
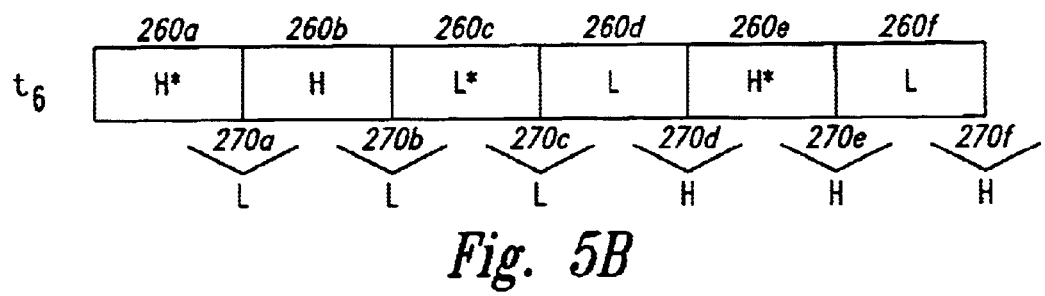
Figure 5C:
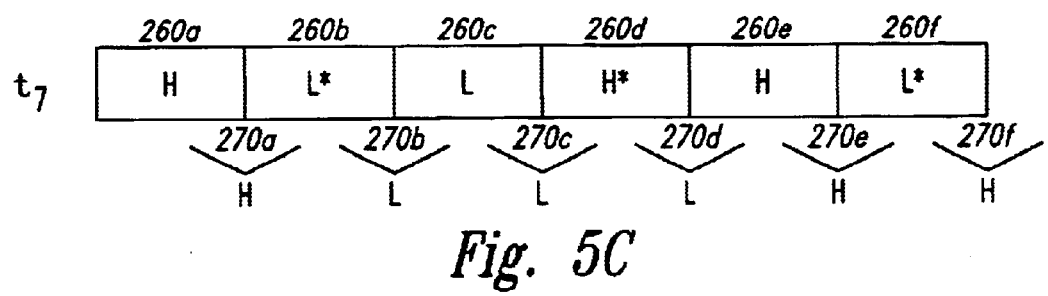
Figure 5D:
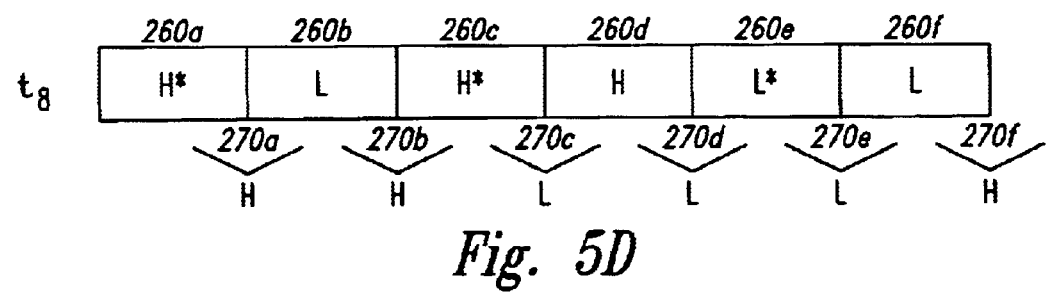
Figure 5E:
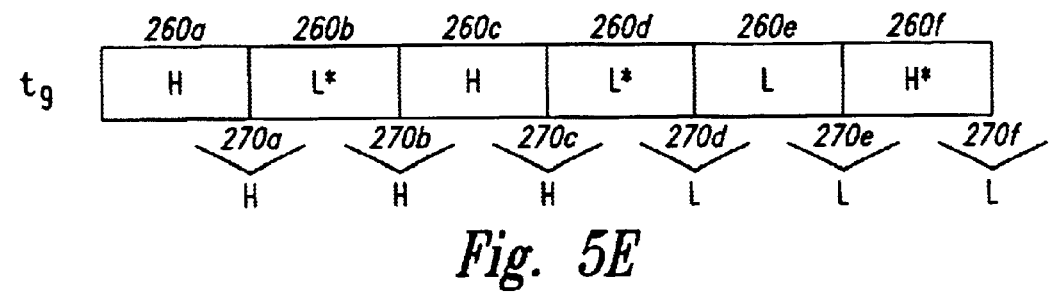

At a time $t_4$, the oscillator stage 204 is disabled by the LOW OSC_EN signal. As a result, the OSC signal is locked to the last logic state and is maintained until the oscillator stage 204 is once again enabled. FIG. 5a illustrates the logic states of the latch stages 260a–260f at time $t_4$. At a time $t_5$, the OSC_EN signal is set HIGH, thus, re-enabling the oscillator stage 204. At a time $t_6$, the OSC signal begins to oscillate starting from the last logic state and causes the shift register 208 to begin shifting data through the latch stages 260a–260f again. Note that because the latch stages 260a–260f latch the data state, re-enabling the oscillator stage 204 allows for the output signals OSC1–OSC6 of the duty cycle correcting circuit 212 to begin from the same respective logic states and to continue from where the respective signals left off when the oscillator stage 204 was disabled.

At a time $t_7$, the OSC signal makes a transition from LOW to HIGH, resulting in the OSC5 and OSC6 signals remaining HIGH. Additionally, although at the time $t_7$ the oscillator stage 204 has been re-enabled for just two transitions of the OSC signal, the OSC1 signal is forced HIGH and the OSC4 signal is forced LOW. The OSC1 and OSC4 signals make their transitions at the time $t_7$ because, as previously mentioned, the shift register 208 allows for the output signals OSC1–OSC6 to restart from where the respective signals left off when the oscillator stage 204 is disabled. In the present example, the OSC1 signal was LOW and the OSC4 signal was HIGH for two transitions of the OSC signal prior to the oscillator stage 204 being disabled. Consequently, because the total number of transitions of the OSC to trigger a transition in an OSCn signal is met at the time $t_7$, the OSC1 and OSC4 signals make respective transitions just the same as if the OSC signal had been continuous, although the OSC signal was in fact interrupted.

FIGS. 5a–5e illustrate the progression of the latched data through the shift register 208 and the corresponding output levels of the duty cycle correcting circuit 212 for the times $t_4$ through $t_9$.

As illustrated by the previous example, a charge pump including oscillator circuitry according to embodiments of the present invention overcomes several of the shortcomings of the conventional charge pump circuit. That is, as described with respect to the oscillator circuit 200, the output signals OSC1–OSC6 that can be used to drive charge pump stages, as well known in the art, have staggered transitions with respect to one another to avoid issues with peak current loading. Additionally, the oscillator circuitry allows for the OSC1–OSC6 signals to be interrupted and restarted from where the respective signal left off prior to the interruption. As previously discussed with respect to conventional charge pump circuits, inefficiencies can result from driving a plurality of pump stages using a continually delayed OSC signal that is always initially applied to the first of the plurality of pump stages. By having the ability to restart the output signals driving the pump stages from relatively the same point at which the respective output signals were interrupted many of these same inefficiencies can be avoided. Moreover, charge pump circuits including oscillator circuitry according to embodiments of the present invention do not rely on a pulse generated signal, and consequently, the resulting charge pump circuits can operate at higher frequencies and are generally more robust at any frequency.

Figure 6:
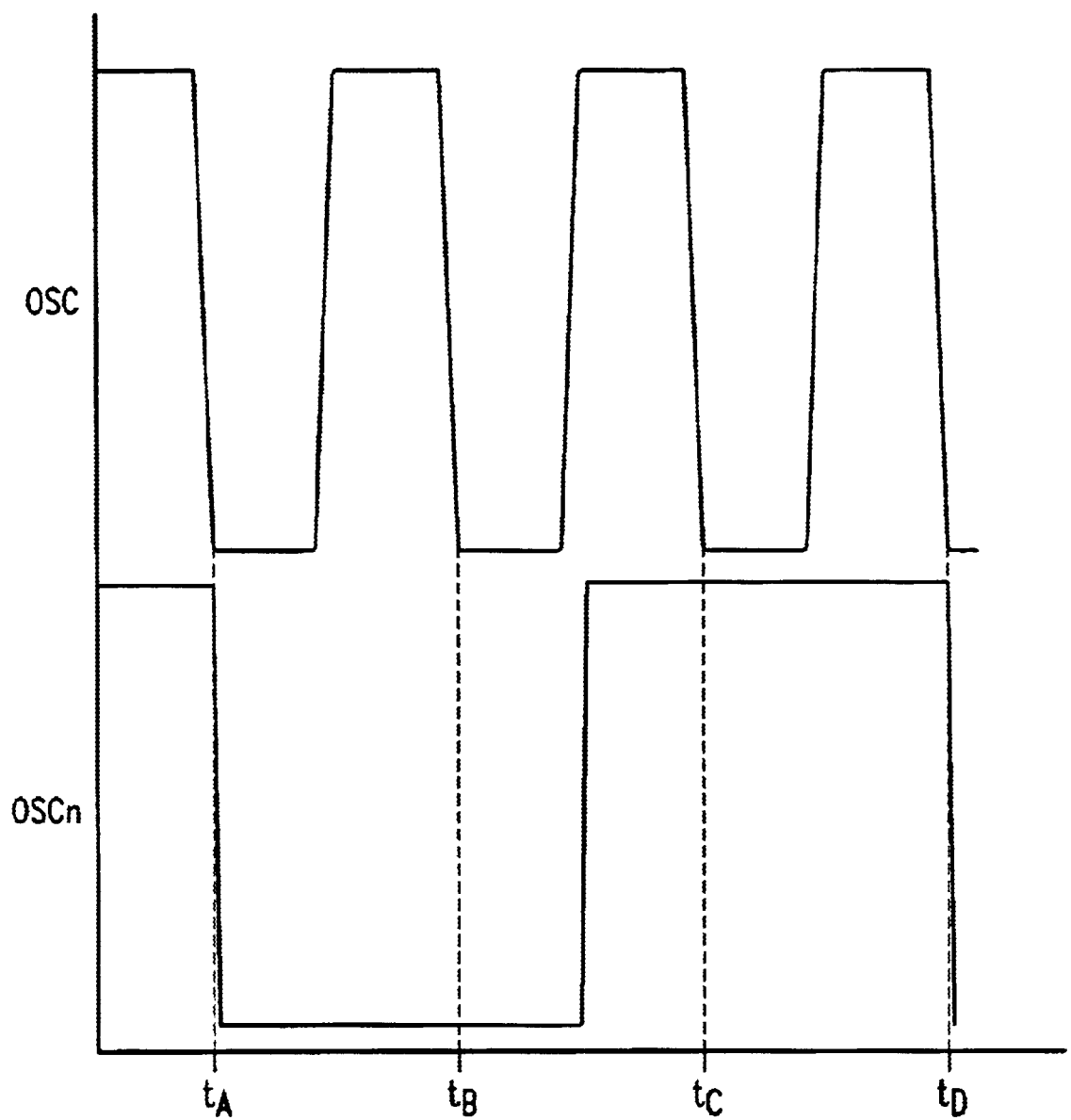
FIG. 6 is a signal diagram illustrating an output signal of the oscillator circuit of FIG. 2 relative to an oscillating input signal.

In another embodiment of the present invention, the oscillator circuit 200 does not include the duty cycle correcting circuit 212, and the output signals provided by the shift register 208 are used to drive the respective pump circuits. However, as illustrated in FIG. 6, an advantage is provided by including a frequency divider circuit, such as the combination of the shift register and duty cycle correcting circuits. As shown in FIG. 6, the frequency of the output signal OSCn is one-third of the oscillator output signal OSC. As a result, the percentage of duty cycle distortion of the OSC signal is reduced by two-thirds. That is, any duty cycle distortion of the OSC signal that occurs between times $t_A$ and $t_B$, as well as between times $t_C$ and $t_D$, will be hidden in the resulting OSCn signal. Duty cycle distortion of the OSCn signal resulting from distortion of the OSC signal will be apparent only during the time between $t_B$ and $t_C$, where the OSCn signal makes a transition.

Figure 7:
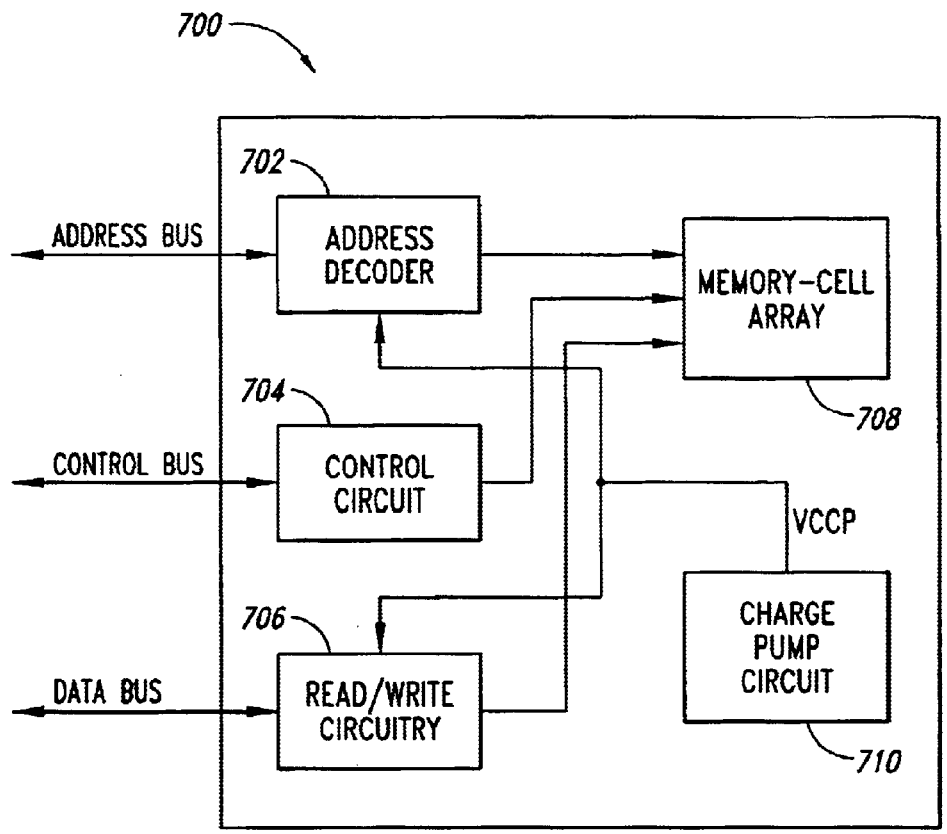
FIG. 7 is a functional block diagrams of a memory device having a charge pump circuit including an oscillator circuit according to an embodiment of the present invention.

FIG. 7 is a block diagram of a dynamic random access memory ("DRAM") 700 including a charge pump circuit 710 having an oscillator circuit according to embodiments of the present invention. The DRAM 700 includes an address decoder 702, control circuit 704, and read/write circuitry 706, all of which are conventional. The address decoder 702, control circuit 704, and read/write circuitry 706 are all coupled to a memory-cell array 708. In addition, the address decoder 702 is coupled to an address bus, the control circuit 704 is coupled to a control bus, and the read/write circuit 706 is coupled to a data bus. The pumped output voltage VCCP from a charge pump circuit 710 may be applied to a number of components within the DRAM 700, as understood by those skilled in the art. In the DRAM 700, the charge pump circuit 710 applies the pumped output voltage VCCP to the read/write circuitry 706, which may utilize this voltage in a data buffer (not shown) to enable that buffer to transmit or receive full logic level signals on the data bus. The charge pump circuit 710 also applies the voltage VCCP to the address decoder 702 which, in turn, may utilize the voltage to apply boosted word line voltages to the array 708. In operation, external circuitry, such as a processor or memory controller, applies address, data, and control signals on the respective busses to transfer data to and from the DRAM 700.

Figure 8:
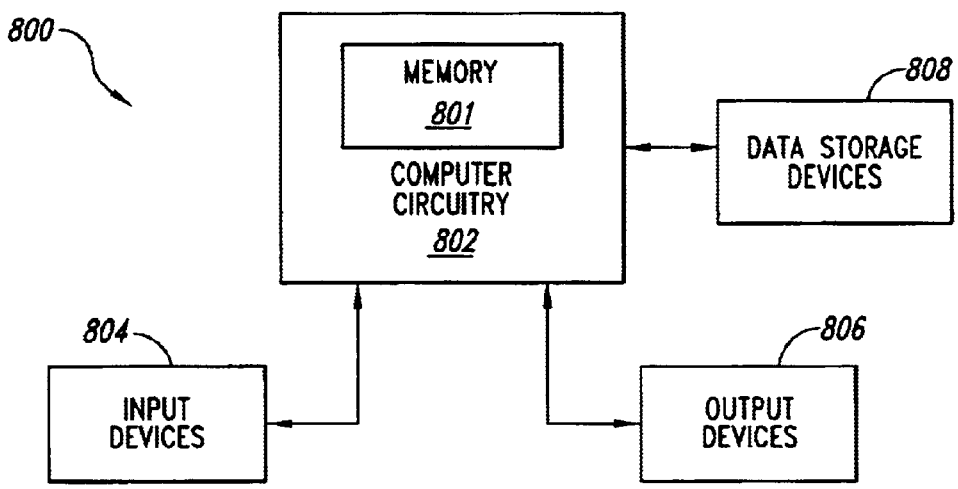
FIG. 8 is a functional block diagram of a computer system including a memory device having a charge pump circuit that includes an oscillator circuit according to an embodiment of the present invention.

FIG. 8 is a block diagram of a computer system 800 including computing circuitry 802. The computing circuitry 802 contains a memory 801, that can be a volatile memory, such as a DRAM, or a non-volatile memory, such as a FLASH memory. The computing circuitry 802 could also contain both a DRAM and FLASH memory. The memory 801 includes charge pump circuitry having oscillator circuitry according to embodiments of the present invention. The computing circuitry 802 performs various computing functions, such as executing specific software to perform specific calculations or tasks. In addition, the computer system 800 includes one or more input devices 804, such as a keyboard or a mouse, coupled to the computer circuitry 802 to allow an operator to interface with the computer system. Typically, the computer system 800 also includes one or more output devices 806 coupled to the computer circuitry 802, such output devices typically being a printer or a video terminal. One or more data storage devices 808 are also typically coupled to the computer circuitry 802 to store data or retrieve data from external storage media (not shown). Examples of typical storage devices 808 include hard and floppy disks, tape cassettes, and compact disc read-only memories (CD-ROMs). The computer circuitry 802 is typically coupled to the memory device 801 through appropriate address, data, and control busses to provide for writing data to and reading data from the memory device.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of generating a plurality of output signals from an oscillating input signal, comprising:

shifting a first set of a plurality of shift register stages coupled in series and latching the respective logic states latched by the first set of shift register stages in response to the oscillating input signal having a first logic state and further shifting a second set of the plurality of the shift register stages and latching the respective logic states latched by the second set of shift register stages in response to the oscillating input signal having a second logic states; and generating each one of the plurality output signals based on the latched logic states of a plurality of the shift register stages.

2. The method of claim 1 wherein generating each output signal based on the latched state of a plurality of the shift register stages comprises performing a Boolean NOR operation on the latched logic states of two of shift register stages.

3. The method of claim 1, further comprising driving a corresponding plurality of charge pump circuits with the plurality of output signals.

4. The method of claim 1 wherein sifting and latching logic states through a plurality of shift register stages comprises:

shifting logic states through n shift registers stages in response to the oscillating input signal; and latching the logic states of each of the n shift register stages after shifting, and wherein generating the plurality of output signals comprises generating n periodic output signals.

5. The method of claim 4 wherein generating the n periodic output signals comprises generating n periodic output signals having the same period, and each of the n periodic output signals having a phase shifted by (1/n) of the period relative to another one of the n periodic output signals.

6. The method of claim 4 wherein generating n periodic output signals comprises generating n periodic output signals having a lower frequency than the oscillating input signal.

7. The method of claim 1 wherein generating each one of the plurality of output signals based on the latched logic states of a plurality of the shift registers comprises generating each of the plurality of output signals based on the latched logic state of one of the shift register stages of the first set and on the latched logic state of one of the shift register stages of the second set.

8. A method of generating a plurality of output signals from an oscillating input signal, the method comprising:

shifting logic states through a series of shift register stages in response to the oscillating input signal;

latching the logic states of each shift register after shifting;

generating a plurality of output signals in response to latching the logic states, each output signal having a logic state based on a plurality of the latched logic states;

interrupting the generation of the plurality of output signals; and resuming the generation of the plurality of output signals from the last latched logic states at the time generation of the plurality of output pulses was interrupted.

9. The method of claim 8 wherein interrupting the generation of the plurality of output signals comprises ceasing provision of the oscillating input signal and resuming the generation of the plurality of output signals comprises resuming provision of the oscillating input signal.

10. The method of claim 8 wherein generating each output signal based on a plurality of latched logic states comprises performing a Boolean NOR operation on two of the latched logic states.

11. The method of claim 8, further comprising driving a corresponding plurality of charge pump circuits with the plurality of output signals.

12. The method of claim 8 wherein shifting logic states through a series of shift register stages and latching the logic states of each shift register comprise shifting a first set of the shift register stages and latching the respective logic states in response to the oscillating input signal having a first logic state and shifting a second set of the shift register stages and latching the respective logic states in response to the oscillating input signal having a second logic state.

13. The method of claim 8 wherein generating a plurality of output signals in response to latching the logic states comprises generating oscillating output signals having a lower frequency than the oscillating input signal.

14. The method of claim 13 wherein the frequency of the oscillating output signals is one third the frequency of the oscillating input signal.

15. The method of claim 13 wherein generating a plurality of output signals comprises generating a plurality of oscillating output signals having respective signal transitions equally spaced over the period of the oscillating output signals.

16. A method of generating of a plurality of output signals from a periodic input signal, the method comprising:

periodically switching a plurality of latched logic states in response to the periodic input signal;

generating a plurality of output signals, each output signal of the plurality having a logic state based on a plurality of the latched logic states;

interrupting the generation of the plurality of output signals;

capturing the logic states at the time generation of the plurality of output signals is interrupted; and resuming generation of the plurality of output signals starting from the captured logic states.

17. The method of claim 16 wherein periodically switching the plurality of latched logic states comprises:

shifting logic states through a series of shift registers stages in response to the periodic input signal; and latching the logic states of each shift register stage after shifting.

18. The method of claim 16 wherein interrupting the generation of the plurality of output signals comprises clamping the periodic input signal to either a first or second logic state.

19. The method of claim 16 wherein generating each output signal based on a plurality of latched logic states comprises performing a Boolean NOR operation on two of the latched logic states.

20. The method of claim 16 wherein periodically switching the plurality of latched logic states comprises:

shifting logic states through n shift registers stages in response to the periodic input signal; and latching the logic states of each of the n shift register stages after shifting, and wherein generating the plurality of output signals comprises generating n periodic output signals.

21. The method of claim 20 wherein generating the n periodic output signals comprises generating n periodic output signals having the same period, and each of the n periodic output signals having a phase shifted by (1/n) of the period relative to another one of the n periodic output signals.

* * * * *

UNITED STATES PATENT AND TRADEMARK OFFICE
CERTIFICATE OF CORRECTION

PATENT NO. : 6,654,306 B2
DATED : November 25, 2003
INVENTOR(S) : Todd A. Merritt and Hal W. Butler It is certified that error appears in the above-identified patent and that said Letters Patent is hereby corrected as shown below:

Column 2,
Line 6, "a OSC" should read -- an OSC --
Line 67, "through to chain" should read -- through the chain --

Column 3,
Line 45, "block diagrams" should read -- block diagram --

Column 5,
Line 27, "At a time to," should read -- At a time $t_0$, --
Line 33, "at a time to." should read -- at a time $t_0$. --
Line 57, "are on-third of" should read -- are one-third of --

Signed and Sealed this

Twentieth Day of July, 2004

JON W. DUDAS
*Acting Director of the United States Patent and Trademark Office*